(12) United States Patent
Lou et al.

(10) Patent No.: US 7,193,455 B2
(45) Date of Patent: Mar. 20, 2007

(54) PROGRAMMABLE/TUNABLE ACTIVE RC FILTER

(75) Inventors: Chih-Hong Lou, I-Ian (TW); Hung-I Chen, Kaohsiung (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/923,892

(22) Filed: Aug. 24, 2004

(65) Prior Publication Data
US 2005/0248394 A1 Nov. 10, 2005

(30) Foreign Application Priority Data
May 6, 2004 (TW) ................................ 93112738 A

(51) Int. Cl.
*H03K 5/00* (2006.01)
(52) U.S. Cl. ........................ 327/553; 327/552; 330/305
(58) Field of Classification Search ........ 327/552–559; 330/305
See application file for complete search history.

(56) References Cited

U.S. PATENT DOCUMENTS 3,983,504 A * 9/1976 Moy ........................... 330/107
6,141,425 A * 10/2000 Murayama et al. ............ 381/98
6,492,876 B1 * 12/2002 Kamal et al. ................ 330/304
6,650,177 B1 * 11/2003 Tan ............................. 327/553
6,714,066 B2 * 3/2004 Gorecki et al. .............. 327/553
6,915,121 B2 * 7/2005 Python et al. ............... 455/266

* cited by examiner

*Primary Examiner*—Dinh T. Le
(74) *Attorney, Agent, or Firm*—Rosenberg, Klein & Lee

(57) ABSTRACT

A programmable/tunable active low-pass filter at least has the resistors, capacitors and shunt control devices. It uses the linear property of the MOSFET to implement the shunt control devices. Based on the first-ordered linear analysis of the transfer function of the active-RC filter, it is found that the cut-off frequency of the active-RC filter can be tuned via the effective small-signal current controlled by the shunt control devices. Therefore, the filter of the present invention allowed users for fine tune the cut-off frequency linearly through the shunt control devices when the variation of the environment or procedure parameters of manufacture (i.e. thermo-effects) cause the cut-off frequency drift, thus, the cut-off frequency can be kept in a constant value. In addition, it needs the different cut-off frequency from the different application. The present invention also provides a device for programming the cut-off frequency to a desired frequency value dependent upon the conditions of application within a big range. Thus, the same filter circuit can be used in many purposes widely.

30 Claims, 3 Drawing Sheets

PROGRAMMABLE/TUNABLE ACTIVE RC FILTER

BACKGROUND OF THE PRESENT INVENTION

1. Field of the Invention

The invention generally relates to analog filter circuits, and more particularly to a method and apparatus for fine tuning and adjusting the cut-off frequency and voltage gain of an active filter.

2. Description of the Prior Art

A filter is an important and familiar component in signal processing systems; and the purpose of the filter is to eliminate the band signals unwanted for retaining and amplifying the band signals desired. Integrating the filters into one chip is a common trend in the manufacture process of the advanced integrated circuit, especially to the communication markets. As the communication system continuously develops, the signal-processing circuits not only require high performances, but also should have a multi-function for a system to process different types of signals. For instance, the 2nd/3rd generation cell phone in wireless communication and V/ADSL (i.e. very high data/asymmetrical digital subscriber line) modem in wired communication, they all require the filters that can be switched in the both systems. Therefore, how to design a filter, which can program the cut-off frequency to an accurate value within a large range, is a main key point in today's signal processes of the communication systems.

The cut-off frequency of a filter is proportional to the reciprocal of time constant $\tau$ (i.e. $f=1/2\pi\tau$), and the time constant $\tau$ is the product of equivalent resistance and capacitance (i.e. $\tau=R \times C$) of the active RC filter. In general, the programmable active RC filters finely tune the value of the cut-off frequency by adjusting the number of operative cells of the resistance or the capacitance. FIG. 1 depicts a conventional programmable filter that using a binary-weighted method to get the capacitance values, the situations (off and on) of the switch devices b0, b1, b2, b3 can determine whether the capacitors connected with the filter are operative or not. Since each of the capacitors is connected in parallel, so that the equivalent capacitance of the filter circuit can be obtained by adding the capacitance of the capacitors connected with the switch devices b0, b1, b2, b3 that is operative. For instance, the equivalent capacitance of the circuit is 0 when the switch devices b0, b1, b2, b3 are all turned off; similarly, the equivalent capacitance of the circuit is 15C when the switch devices b0, b1, b2, b3 are all turned on. Thus, the combination of the switch devices b0, b1, b2, b3 is the control code of the circuit that can be used to control the equivalent capacitance of the filter and then can achieve the purpose of fine tuning the cut-off frequency.

According to the fundamental principle of active filters, the cut-off frequency is in direct proportion to the reciprocal of the product of equivalent resistance and equivalent capacitance of the circuit (i.e. $f = 1/2\pi\tau = 1/(2\pi R \times C)$). Hence, the relation (as shown in FIG. 1) between the control code and the cut-off frequency of a filter is non-linear regardless of the equivalent resistance or the equivalent capacitance is tuned. In applications, besides, when the cut-off frequency is required of being adjusted within certain accuracy, the number of control bits will be determined by the largest slope part of the curve. It is therefore that it will increase the number of devices of the circuits and reduce the control efficiency; thus, it will make it become more difficult to design in an integrated circuit. In addition, since the cut-off frequency of such kind of filters can only be tuned within a fixed range, the applications of that are limited in the kind of filters.

The present invention uses controllable shunt devices that can be controlled by a continuity control method to avoid some problems caused by the above-mentioned non-continuity control method. Accordingly, it can not only increase the control efficiency, reduce the area of the circuits and carry out the resolution which is difficult to achieve when using digital signals for control, but also extend the tuning range of the cut-off frequency and increase the applications of the circuits for the multi-function purpose.

SUMMARY OF THE INVENTION

As is described above, the problems of techniques in the prior art are limited in applications, and with low control efficiency and large circuit area; thus, one of the purposes of the present invention is to provide a filter circuit having an utility of tuning the cut-off frequency; in this regard, it can make the cut-off frequency be shifted within a tuning rage and be tuned to a desired band according to the practical applications for achieving the multi-function purpose.

Another one of the purposes of the present invention is to provide a filter circuit having a utility of tuning the cut-off frequency that can narrow the tuning range of the cut-off frequency and increase the level of tuning accuracy with a constant number of control bits for achieving a higher control resolution.

Still another one of the purposes of the present invention is to provide a fine tune apparatus having a linear relation with the cut-off frequency of a filter circuit; in this regard, it can accurately tune the cut-off frequency to a desired value for compensating the parameter variations due to the manufacture process or the environments. Besides, it has a smaller circuit area under the same accuracy.

Still another one of the purposes of the present invention is to provide a voltage gain tuning apparatus of a filter for tuning the voltage gain after the tuning of the cut-off frequency is tuned.

According to the above-mentioned description, the present invention provides a programmable/tunable active RC filter, including a first field effect transistor device composed of a first field effect transistor component and a second field effect transistor component; a second field effect transistor device composed of another first field effect transistor component and another second field effect transistor component; a differential amplifier composed of two input terminals and two output terminals; two first variable resistors $R_f$, wherein one end of the two first variable resistors are respectively connected to the input terminals of the differential amplifier, another end of the two first variable resistors are respectively connected to the first endpoints of the first field effect transistor device and the second endpoints of the second field effect transistor device; two second variable resistors $R_p$, wherein one end of the two second variable resistors are respectively connected to a first signal input terminal and a second signal input terminal, and another end of the two second variable resistors are respectively connected to another end of the two first variable resistors; and two capacitors, wherein each of the two capacitors is respectively connected to the two input terminals and the two output terminals of the differential amplifier for forming the active RC filter and then being outputted from two output terminals of the two capacitors.

DESCRIPTION OF THE PREFERRED EMBODIMENT

The following descriptions about the circuit of the present invention not include the complete structure of the active filter. It just quotes the key points of traditional techniques for illustrates the present invention. Moreover, all of the drawings relates to the present invention don't accord the scale, they are just used to represent the characteristics of structure of present invention.

Figure 1:
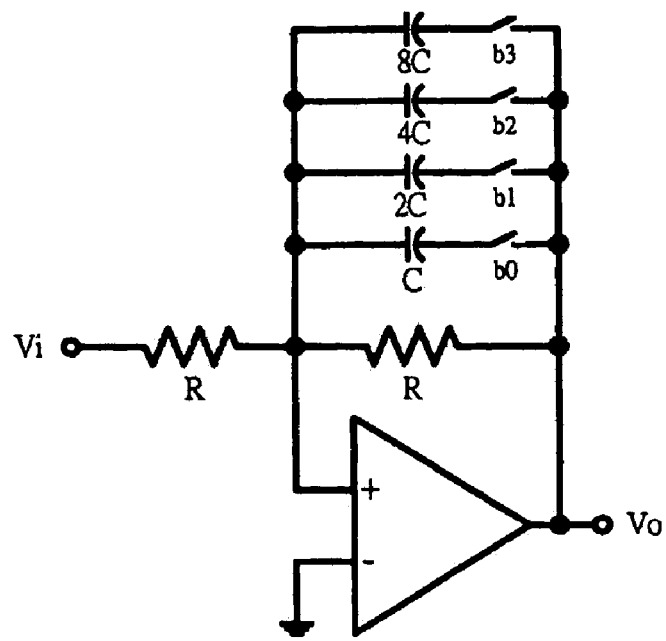
FIG. 1 is a circuit diagram of the active filter with a binary-weighted capacitor circuit.
Figure 2:
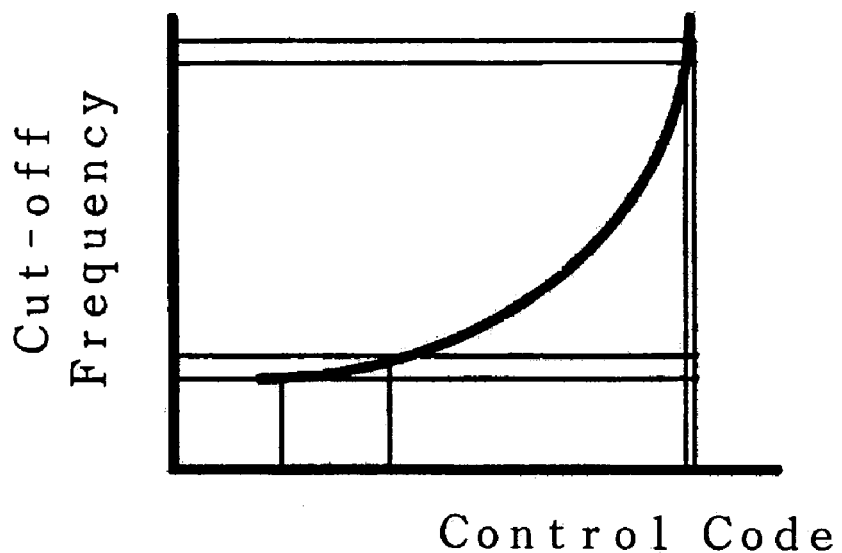
FIG. 2 is a relation diagram between the cut-off frequency and the control code of general active filters.
Figure 3:
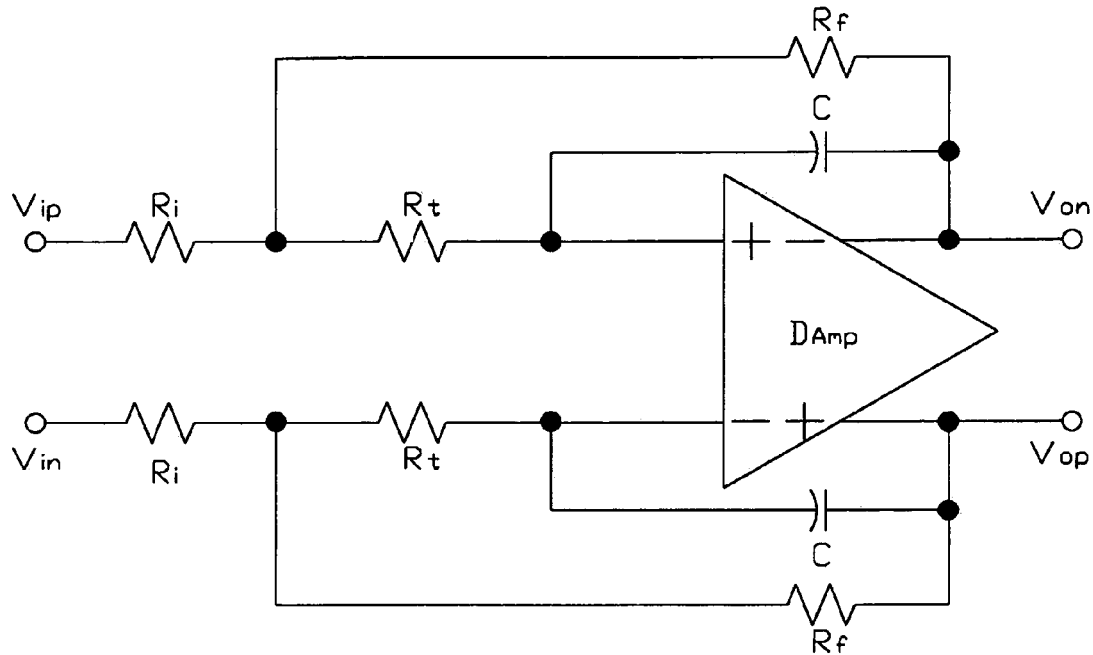
FIG. 3 is a circuit diagram of an improved active filter.

FIG. 3 depicts an embodiment according to the present invention. The circuit is composed of a differential amplifier $D_{Amp}$ with two input terminals and two output terminals, the resistors $R_f$, $R_i$, $R_t$ and the capacitor C. The upper half-portion and the lower half-portion are symmetry since the differential amplifier of the embodiment is composed of two input terminals and two output terminals. By using the small-signals analysis method to obtain the equivalent resistance $R_e$ and the cut-off frequency $F_{cut}$:

$$R_e = R_f + \left(1 + \frac{R_f}{R_i}\right) \times R_t \ \Omega$$

$$F_{cut} = \frac{1}{2\pi \times \left[R_f + R_t \times \left(1 + \frac{R_f}{R_i}\right)\right] \times C} Hz$$

According to the above equations, the cut-off frequency of the filter can be accurately tuned to the desired value when one of the resistors of the equations can be controlled by the continuity control method and the control range is appropriate. However, since the direct current gain of the filter is dependent upon the resistances of the resistors $R_t$ and $R_f$, the present invention carries out a continuity control of $R_t$ for achieving the purpose of higher performance of the circuit.

Figure 4:
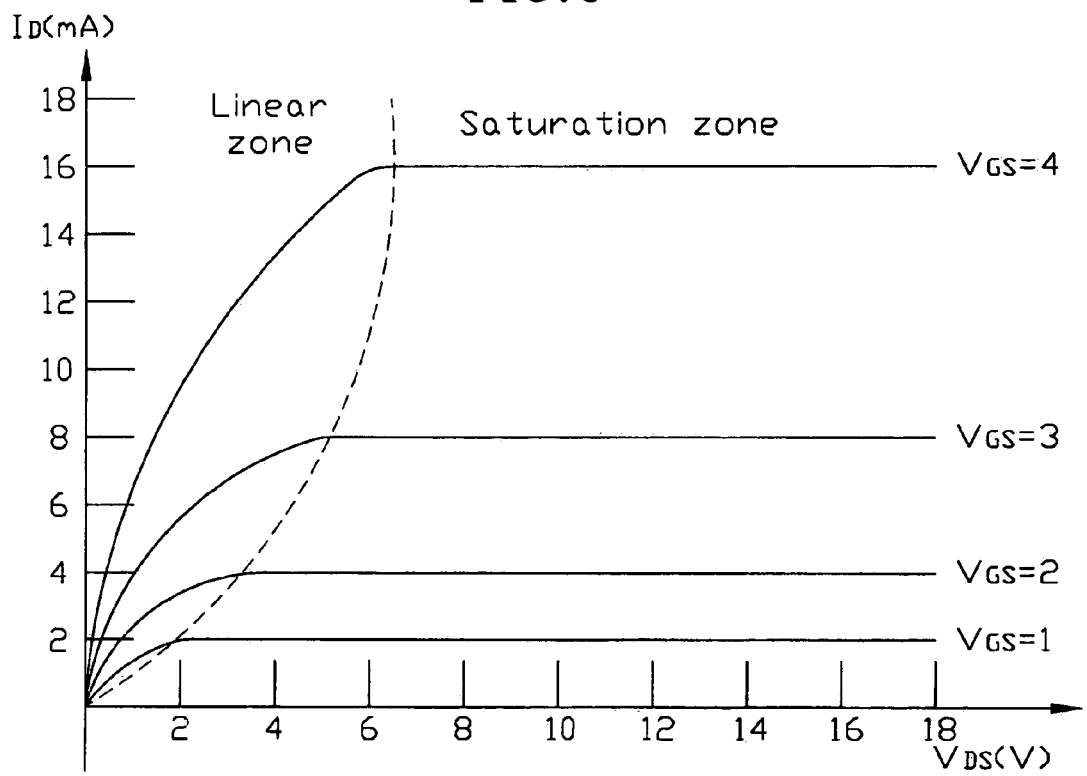
FIG. 4 is a characteristic diagram of field effect transistors.

In view of the above, the present invention carries out a variable resistor by using the resistance characteristic of the linear operative zone of a field effect transistor (i.e. FET). FIG. 4 depicts a current-voltage characteristic diagram (i.e. I-V curve) of a field effect transistor. As shown in FIG. 4, the field effect transistor has two main operative zones, linear zone and saturation zone. When the field effect transistor is operated under the liner zone, the relation between the drain current $I_D$ and the voltage between drain and source $V_{DS}$ roughly corresponds to Ohm's law; while Ohm's curve of the linear zone is different when the voltage between gate and source $V_{GS}$ is changed. Accordingly, when the voltage between drain and source $V_{DS}$ vibrates within a small magnitude range (for instance, 0~2 volt), the field effect transistor can be considered as a resistor device. When the voltage between gate and source $V_{GS}$ is adjusted within an appropriate range (for instance, 0~4 volt) and the different resistance effects can be obtained, the field effect transistor can be further considered as a variable resistor device.

Further, it is difficult for digital control method to acquire the accurate resistance as well as the above-mentioned method does.

Figure 5:
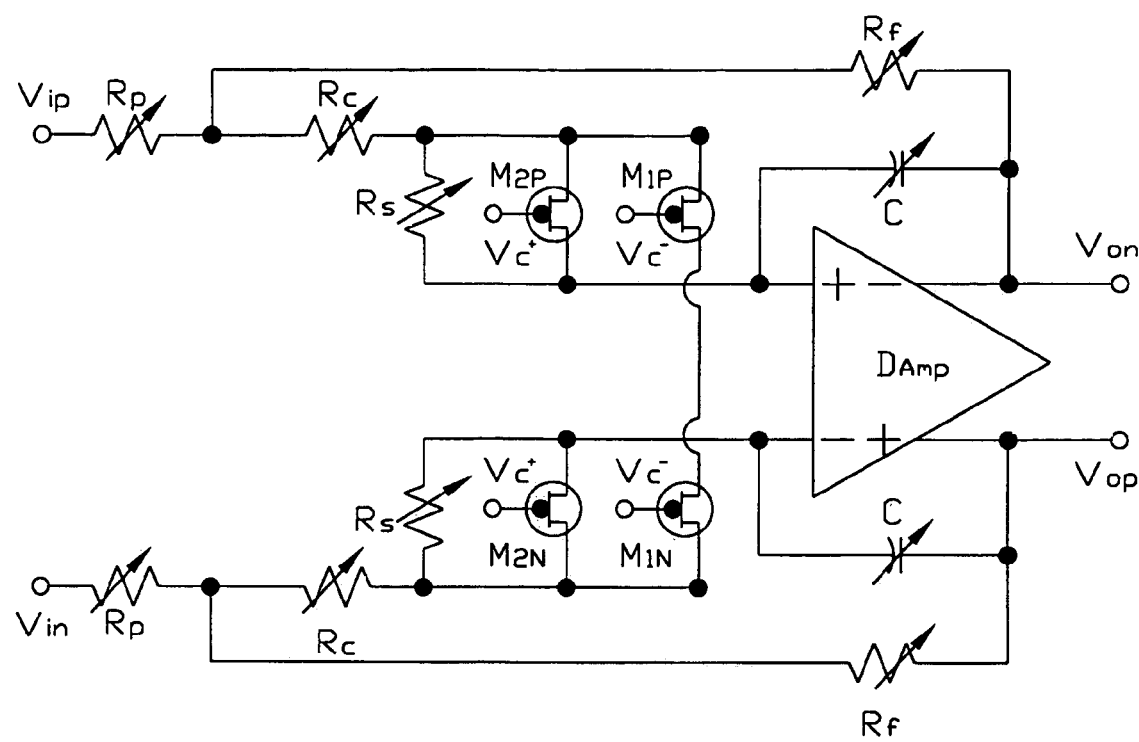
FIG. 5 is a circuit diagram of an embodiment according to the present invention.

FIG. 5 depicts a circuit diagram of an embodiment according to the present invention. The filter circuit of the embodiment carries out a variable resistor by using the resistance characteristic of the linear operative zone of the field effect transistors $M_{1P}$, $M_{1N}$, $M_{2P}$ and $M_{2N}$. Since the upper half-portion and the lower half-portion are symmetry, the field effect transistors $M_{1P}$, $M_{1N}$, $M_{2P}$ and $M_{2N}$ should be the same. For instance, the field effect transistors can be P-type field effect transistors totally or N-type field effect transistors totally. Besides, the variable resistors $R_p$, $R_f$, $R_c$, $R_s$ and the variable capacitor C can be implemented by the conventional devices or circuits, such as the binary-weighted resistor structure, the binary-weighted capacitor structure or the resistor ladders. In the embodiment, the binary-weighted resistor method and the binary-weighted capacitor method are preferred. When the filter circuit is under operation, the voltages between gates and sources $V_{GS}$ of the field effect transistors $M_{1P}$, $M_{1N}$, $M_{2P}$ and $M_{2N}$ are adjusted by using an additional differential voltage $V_c^+/V_c^-$, and therefore the equivalent resistance of the field effect transistors is also changed. Further, the differential voltage $V_c^+/V_c^-$ is composed of a given DC voltage (for instance, 5V) that increases or deceases a small magnitude voltage (for instance, 1V); that is, $V_c^+=6V$ and $V_c^-=4V$. As shown in FIG. 5, the field effect transistors $M_{1P}$, $M_{1N}$, $M_{2P}$ and $M_{2N}$ are four controllable shunt devices of the circuit. With the desired equivalent resistance that acquired by the appropriate controlling of the differential voltage $V_c^+/V_c^-$ upon the four field effect transistors, the filter circuit can be controlled under a preset (predetermined) operative frequency. Furthermore, a controllable shunt device having single input terminal and two output terminals is composed of the field effect transistors $M_{1P}$, $M_{2P}$, wherein the gate of the controllable shunt device is connected to the differential voltage $V_c^+/V_c^-$. On the other hand, another controllable shunt device having single input terminal and two output terminals is composed of the field effect transistors $M_{1N}$, $M_{2N}$, wherein gate of the controllable shunt device is connected to the differential voltage $V_c^+/V_c^-$.

If the equivalent resistance of the field effect transistors $M_{1P}$, $M_{1N}$ operated under a linear zone is $R_{m1}$, the equivalent resistance of the field effect transistors $M_{2P}$, $M_{2N}$ operated under a linear zone is $R_{m2}$, and all devices of the circuit are considered together to take an overview, thus the equivalent resistance $R_e$ and the cut-off frequency $F_{cut}$ can be obtained by using the small-signals analysis method of the active RC filter:

$$R_e = \frac{R_f + \left(1 + \frac{R_f}{R_p}\right) \times \left[R_c + \frac{R_s \cdot (R_{m1} // R_{m2})}{R_s + R_{m1} // R_{m2}}\right]}{\frac{R_{m1} // R_{m2}}{R_s + R_{m1} // R_{m2}} + a\left(\frac{R_s}{R_s + R_{m1} // R_{m2}}\right)} \Omega$$

$$F_{cut} = \frac{\frac{R_p}{R_p + R_f}\left(\frac{R_{m1} // R_{m2}}{R_s + R_{m1} // R_{m2}} + \frac{R_s}{R_s + R_{m1} // R_{m2}} \cdot a\right)}{2\pi \times \left[R_c + R_s\left(\frac{R_{m1} // R_{m2}}{R_s + R_{m1} // R_{m2}}\right) + R_f\left(\frac{R_p}{R_p + R_f}\right)\right] \times C} Hz$$

wherein the parameter "a" is the ratio of the current flowed through the field effect transistors $M_{2P}/M_{2N}$ to the total current flowed through the field effect transistors $M_{1P}/M_{1N}$ and $M_{2P}/M_{2N}$, that is, $a=R_{m1}/(R_{m1}+R_{m2})$. Let $R_c>>R_{m1}/R_{m2}$ and $R_s>>R_{m1}//R_{m2}$ when making a circuit design, then $$F_{cut} \approx \frac{\frac{R_p}{R_p+R_f} \cdot a}{2\pi \times \left[R_c + R_f \frac{R_p}{R_p+R_f}\right] \times C} \text{Hz}$$

Therefore, by using the differential voltage $V_c^+/V_c^-$ to continuously control the parameter "a" within 0 and 1, and the design value of other resistors and capacitors accompanied, the cut-off frequency of the filter can be accurately tuned to the desired value.

Referring to FIG. 5 again, the equivalent resistance of the field effect transistors relative to the transient operative point is not of a fully-linear relation after the differential voltage $V_c^+/V_c^-$ is inputted to the field effect transistors $M_{1P}$, $M_{1N}$, $M_{2P}$ and $M_{2N}$. Therefore, according to the above-mentioned equivalent resistance equation, the linearity of the filter circuit is increased along with the addition of the parallel variable resistors $R_s$. Besides, according to the above-mentioned cut-off frequency equation, the tuning band of the cut-off frequency is shifted with the addition of the variable resistors $R_c$. At this time, the cut-off frequency of the filter circuit can be adjusted to a frequency range by tuning the variable resistors $R_c$, in this regard, the variable resistors $R_s$ can narrow the tuning range of the cut-off frequency. Finally, according to the fundamental principle of active filters, it is realized that the voltage gain of the filter circuit is determined by the variable resistances $R_p$ and $R_f$ (i.e. $-R_f/R_p$). Therefore, when the cut-off frequency is tuned to a desired value, then the resistances of the variable resistors $R_p$ and $R_f$ are tuned for achieving the purpose of tuning the voltage gain. Besides, since the input signal is an AC voltage signal, thus drain and source of the field effect transistors $M_{1P}$, $M_{1N}$, $M_{2P}$ and $M_{2N}$ will be changed as the AC voltage signal is changed.

According to the above-mentioned description, when the filter circuit of FIG. 5 is under operation, the cut-off frequency of the filter can be positioned to a desired band by tuning the series variable resistors $R_c$ at first; further, it is determined as regards the application fields. For instance, when a filter is applied to a component of a GSM/CDMA (i.e. global standard for mobile/code division multiple access) dual module system, the cut-off frequency can be positioned in a frequency band that is determined by series variable resistors $R_c$. The frequency band is adjusted to a frequency band or selected in a wireless communication; for instance, to a GSM/CDMA dual module system, the frequency band is GSM band or CDMA band. Further, by tuning the parallel variable resistors $R_s$ to narrow the tuning range of the cut-off frequency, then the cut-off frequency can approach to the desired value and the control resolution can be increased too. Next, by using the differential control signal $V_c^+/V_c^-$ to adjust the equivalent resistance of the field effect transistors $M_{1P}$, $M_{1N}$, $M_{2P}$ and $M_{2N}$, thus, the cut-off frequency can be fine tuned to a desired value and then the frequency that pass through of the filter will be sent to a radio transceiver of the dual module system. When the cut-off frequency of the active RC filter is tuned to a desired value, then the resistances of the variable resistors $R_p$ and $R_f$ are tuned for achieving the purpose of tuning the voltage gain of the active RC filter.

Finally, since the noise frequency spectrum density of the filter circuit is determined by the equivalent resistance; thus, when the operation band of the filter is needed to change in a wide range, tuning of the equivalent capacitance is available to avoid the substantial variation of the noise frequency spectrum density caused by tuning of the equivalent resistance. Accordingly, the capacitor components in the circuits of FIG. 5 are implemented by a variable capacitor C by using the binary-weighted method. The types of the variable resistor apparatus in embodiments of the present invention are not restricted except the controllable shunt devices that should be implemented by the field effect transistors, and it can be implemented by the resistor ladders, binary-weighted circuits according to the criterion of the designer.

While this invention has been described with reference to illustrative embodiments, this description does not intend or construe in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A programmable/tunable active RC filter, comprising:
   a first field effect transistor device composed of a first field effect transistor component and a second field effect transistor component, wherein each gate of said first field effect transistor component and said second field effect transistor component is respectively connected to a first voltage source and a second voltage source, and a first endpoint of said first field effect transistor component is connected to a first endpoint of said second field effect transistor component;
   a second field effect transistor device composed of a first field effect transistor component and a second field effect transistor component, wherein each gate of said first field effect transistor component and said second field effect transistor component is respectively connected to said first voltage source and said second voltage source, and a second endpoint of said first field effect transistor component is connected to a second endpoint of said second field effect transistor component, and said first endpoint of said first field effect transistor component of said second field effect transistor device is connected to said second endpoint of said first field effect transistor component of said first field effect transistor device;
   a differential amplifier having two input terminals and two output terminals, wherein each of said two input terminals is respectively connected to said second endpoint of said second field effect transistor component of said first field effect transistor device, and said first endpoint of said second field effect transistor component of said second field effect transistor device;
   two first variable resistors $R_f$, wherein one end of each said two first variable resistor is respectively connected to said output terminals of said differential amplifier, another end of each said two first variable resistor is respectively connected to said first endpoints of said first field effect transistor devices and said second endpoints of said second field effect transistor devices;
   two second variable resistors $R_p$, wherein one end of each said two second variable resistor is respectively connected to a first signal input terminal and a second signal input terminal, and another end of each said two second variable resistor is respectively connected to another end of said two first variable resistors; and
   two capacitors, wherein each of said two capacitors is respectively connected to said two input terminals and said two output terminals of said differential amplifier for forming said active RC filter and then being outputted from two output terminals of said two capacitors.

2. The programmable/tunable active RC filter according to claim 1, further comprising:

two third variable resistors $R_s$, wherein each of said two third variable resistors is respectively used to connect said first endpoints and said second endpoints of said second field effect transistor component of said first field effect transistor device and said second field effect transistor component of said second field effect transistor device.

3. The programmable/tunable active RC filter according to claim 1, further comprising:

two fourth variable resistors $R_c$, wherein one end of each said two fourth variable resistor is respectively connected to another end of said two first variable resistors and said two second variable resistors, and another end of each said two fourth variable resistor is respectively connected to said first endpoints of said first field effect transistor devices and said second endpoints of said second field effect transistor devices.

4. The programmable/tunable active RC filter according to claim 1, wherein said first field effect transistor device and said second field effect transistor device are both composed of P-type field effect transistor components.

5. The programmable/tunable active RC filter according to claim 1, wherein said first field effect transistor device and said second field effect transistor device are both composed of N-type field effect transistor components.

6. The programmable/tunable active RC filter according to claim 1, wherein there is a differential voltage between said first voltage source and said second voltage source.

7. The programmable/tunable active RC filter according to claim 1, wherein said first field effect transistor device and said second field effect transistor device are operated under a linear operative zone.

8. The programmable/tunable active RC filter according to claim 1, wherein each of said two first variable resistors, said two second variable resistors, said two third variable resistors and said two fourth variable resistors is a binary-weighted resistor circuit structure.

9. The programmable/tunable active RC filter according to claim 2, wherein said two third variable resistors are capable of adjusting said programmable/tunable active RC filter to a tuning range.

10. The programmable/tunable active RC filter according to claim 3, wherein said two fourth variable resistors are capable of adjusting said programmable/tunable active RC filter to a frequency band.

11. The programmable/tunable active RC filter according to claim 6, wherein said first field effect transistor device and said second field effect transistor device are adjusted by tuning said differential voltage for adjusting a cut-off frequency of said programmable/tunable active RC filter.

12. The programmable/tunable active RC filter according to claim 1, wherein said two second variable resistors are capable of adjusting said programmable/tunable active RC filter to a voltage gain.

13. The programmable/tunable active RC filter according to claim 1, wherein each of said two capacitors is a binary-weighted capacitor circuit structure.

14. A method of carrying out a programmable/tunable active RC filter comprising a first field effect transistor device, a second field effect transistor device, a differential amplifier, two first variable resistors, two second variable resistors, two third variable resistors, and two capacitors, the method comprising:

adjusting said programmable/tunable active RC filter to a frequency band by tuning said two third variable resistors;

determining a cut-off frequency of said programmable/tunable active RC filter within said frequency band by tuning a bias voltage of said first field effect transistor device and said second field effect transistor device; and adjusting said programmable/tunable active RC filter to a voltage gain by tuning resistance of said two first variable resistors and said two second variable resistors after said cut-off frequency has been determined, wherein said first field effect transistor device is composed of a first field effect transistor component and a second field effect transistor component, each gate of said first field effect transistor component and said second field effect transistor component being respectively connected to a first voltage source and a second voltage source, a first endpoint of said first field effect transistor component being connected to a first endpoint of said second field effect transistor component;

wherein said second field effect transistor device is composed of a first field effect transistor component and a second field effect transistor component, each gate of said first field effect transistor component and said second field effect transistor component being respectively connected to said first voltage source and said second voltage source, a second endpoint of said first field effect transistor component being connected to a second endpoint of said second field effect transistor component, and said first endpoint of said first field effect transistor component of said second field effect transistor device being connected to said second endpoint of said first field effect transistor component of said first field effect transistor device;

wherein said differential amplifier has two input terminals and two output terminals, each of said two input terminals being respectively connected to said second endpoint of said second field effect transistor component of said first field effect transistor device and said first endpoint of said second field effect transistor component of said second field effect transistor device;

wherein one end of each said two first variable resistor is respectively connected to said output terminals of said differential amplifier, another end of each said two first variable resistor $R_f$ being respectively electrically connected to said first endpoints of said first field effect transistor devices and said second endpoints of said second field effect transistor devices;

wherein one end of each said two second variable resistor is respectively connected to a first signal input terminal and a second signal input terminal, and another end of each said two second variable resistor being respectively connected to another end of said two first variable resistors;

wherein one end of each said two third variable resistors is respectively connected to another end of said two first variable resistors and said two second variable resistors, and another end of each said two third variable resistor being respectively electrically connected to said first endpoints of said first field effect transistor devices and said second endpoints of said second field effect transistor devices; and wherein each of said two capacitors is respectively connected to said two input terminals and said two output terminals of said differential amplifier for forming said active RC filter and then being outputted from two output terminals of said two capacitors.

15. The method according to claim 14, wherein said programmable/tunable active RC filter further comprises two fourth variable resistors and the method further comprises:
adjusting said programmable/tunable active RC filter to a frequency range by tuning said two fourth variable resistors,
wherein each of said two fourth variable resistors is respectively used to connect said first endpoints and said second endpoints of said second field effect transistor component of said first field effect transistor device and said second field effect transistor component of said second field effect transistor device.

16. The method according to claim 14, wherein each of said two first variable resistors, said two second variable resistors, and said two third variable resistors is a binary-weighted resistor circuit structure.

17. The method according to claim 15, wherein each of said two fourth variable resistors is a binary-weighted resistor circuit structure.

18. The method according to claim 14, wherein equivalent resistances of said first field effect transistor device and said second field effect transistor device depend on said bias voltage.

19. The method according to claim 14, wherein said two capacitors are variable capacitors and the method further comprises adjusting said variable capacitors before tuning said frequency range.

20. The method according to claim 19, wherein said variable capacitor is a binary-weighted resistor circuit structure.

21. A dual module portable wireless communication system having a programmable/tunable active RC filter, comprising:
a first field effect transistor device composed of a first field effect transistor component and a second field effect transistor component, wherein each gate of said first field effect transistor component and said second field effect transistor component is respectively connected to a first voltage source and a second voltage source, and a first endpoint of said first field effect transistor component is connected to a first endpoint of said second field effect transistor component;
a second field effect transistor device composed of a first field effect transistor component and a second field effect transistor component, each gate of said first field effect transistor component and said second field effect transistor component is respectively connected to said first voltage source and said second voltage source, and a second endpoint of said first field effect transistor component is connected to a second endpoint of said second field effect transistor component, and said first endpoint of said first field effect transistor component of said second field effect transistor device is connected to said second endpoint of said first field effect transistor component of said first field effect transistor device;
a differential amplifier having two input terminals and two output terminals, wherein each of said two input terminals is respectively connected to said second endpoint of said second field effect transistor component of said first field effect transistor device, and said first endpoint of said second field effect transistor component of said second field effect transistor device;
two first variable resistors $R_f$, wherein one end of each said two first variable resistor is respectively connected to said output terminals of said differential amplifier;
two second variable resistors $R_c$, wherein one end of each said two second variable resistor is respectively connected to said first endpoints of said second field effect transistor component of said first field effect transistor device and said second endpoints of said second field effect transistor components of said second field effect transistor device, another end of each said two second variable resistor is respectively connected to another end of each said two first variable resistor;
two third variable resistors $R_p$, wherein one end of each said two third variable resistor is respectively connected to a first signal input terminal and a second signal input terminal, and another end of each said two third variable resistor is respectively connected to another ends of each said two first variable resistor and each said two second variable resistor;
two variable capacitors, wherein each of said two variable capacitors is respectively connected to said two input terminals and said two output terminals of said differential amplifier for forming said programmable/tunable active RC filter and then is outputted from two output terminals of said two variable capacitors; and
a radio transceiver, wherein said radio transceiver receives signals outputting from said programmable/tunable active RC filter in said dual module portable wireless communication system.

22. The system according to claim 21, further comprising:
two fourth variable resistors $R_s$, wherein each of said two fourth variable resistors is respectively connected to said second endpoints and said first endpoints of said first field effect transistor devices and said second field effect transistor devices.

23. The system according to claim 21, wherein there is a differential voltage between said first voltage source and said second voltage source.

24. The system according to claim 21, wherein said first field effect transistor device and said second field effect transistor device are operated under a linear operative zone.

25. The system according to claim 22, wherein each of said two first variable resistors, said two second variable resistors and said two third variable resistors is a binary-weighted resistor circuit structure.

26. The system according to claim 22, wherein each of said two fourth variable resistors is a binary-weighted resistor circuit structure.

27. The system according to claim 21, wherein said two second variable resistors are capable of adjusting said programmable/tunable active RC filter to a GSM frequency band or a CDMA frequency band.

28. The system according to claim 22, wherein said two fourth variable resistors are capable of adjusting said programmable/tunable active RC filter to a frequency range.

29. The system according to claim 23, wherein said first field effect transistor device and said second field effect transistor device are adjusted by tuning said differential voltage for adjusting said programmable/tunable active RC filter to a frequency.

30. The system according to claim 22, wherein said two third variable resistors are capable of adjusting said programmable/tunable active RC filter to a voltage gain.

* * * * *